(12) United States Patent
Pan

(10) Patent No.: US 7,202,123 B1
(45) Date of Patent: Apr. 10, 2007

(54) MESA ISOLATION TECHNOLOGY FOR EXTREMELY THIN SILICON-ON-INSULATOR SEMICONDUCTOR DEVICES

(75) Inventor: James Pan, Fishkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/882,208

(22) Filed: Jul. 2, 2004

(51) Int. Cl.
*H01L 21/336* (2006.01)

(52) U.S. Cl. .............. 438/197; 438/287; 257/E21.32; 257/E21.561

(58) Field of Classification Search ............... 438/142, 438/149, 150–156, 197–200, 216, 219, 287–290, 438/300–306, 478, 505, 506; 257/E21.32, 257/E21.561
See application file for complete search history.

(56) References Cited

U.S. PATENT DOCUMENTS

| | | | |
|---|---|---|---|
| 4,753,896 A | 6/1988 | Matloubian | |
| 5,028,564 A | 7/1991 | Chang et al. | |
| 5,164,326 A | 11/1992 | Foerstner et al. | |
| 5,334,281 A | 8/1994 | Doerre et al. | |
| 5,482,871 A | 1/1996 | Pollack | |
| 5,663,588 A | 9/1997 | Suzuki et al. | |
| 5,846,858 A | 12/1998 | Kerber | |
| 5,924,000 A | 7/1999 | Linliu | |
| 6,037,196 A | 3/2000 | Schwalke | |
| 6,037,266 A * | 3/2000 | Tao et al. | 438/719 |
| 6,064,092 A | 5/2000 | Park | |
| 6,420,218 B1 * | 7/2002 | Yu | 438/142 |
| 6,673,694 B2 | 1/2004 | Borenstein | |
| 6,881,631 B2 * | 4/2005 | Saito et al. | 438/283 |
| 2002/0042183 A1 | 4/2002 | Chan et al. | |
| 2002/0182784 A1 * | 12/2002 | Hirashita et al. | 438/149 |
| 2003/0232459 A1 * | 12/2003 | Yasukawa | 438/57 |

OTHER PUBLICATIONS

"Wafer Products: Advantox MLD-UT." http://www.ibis.com/wafer-products-advantox-MLD-UT.htm pp. 2 (unknown date).
"Wafer Products" http://www..ibis.com/wafer.htm pp. 2 (unknown date).
"Wafer Products: Advantox MLD" http://www.ibis.com/wafer-products-advantox-MLD.htm pp. 2 (unknown date).
"Wafer Products: SIMOX 400" http://www.ibis.com/wafer-products-simox-400.htm pp. 2 (unknown date).

* cited by examiner

*Primary Examiner*—Brook Kebede

(57) ABSTRACT

Silicon-on-insulator (SOI) structures with silicon layers less than 20 nm in thickness are used to form extremely thin silicon-on-insulator (ETSOI) semiconductor devices. ETSOI semiconductor devices can be efficiently manufactured by mesa isolation techniques. A method of forming a plurality of semiconductor devices is provided comprising a SOI structure. The SOI structure comprises a substrate, an insulating layer overlying the substrate, and a silicon layer overlying the insulating layer, wherein the silicon layer has a thickness less than 20 nm. The silicon layer is patterned to create at least two laterally spaced apart silicon layers. A semiconductor device is formed at each of the at least two laterally spaced apart silicon layers.

20 Claims, 10 Drawing Sheets

MESA ISOLATION TECHNOLOGY FOR EXTREMELY THIN SILICON-ON-INSULATOR SEMICONDUCTOR DEVICES

FIELD OF THE INVENTION

The present invention relates to semiconductor devices and methods of manufacturing semiconductor devices and, more particularly, to an improved semiconductor device comprising silicon-on-insulator (SOI) technology.

BACKGROUND OF THE INVENTION

An important aim of ongoing research in the semiconductor industry is increasing semiconductor performance while decreasing power consumption in semiconductor devices. Planar transistors, such as metal oxide semiconductor field effect transistors (MOSFETs) are particularly well suited for use in high-density integrated circuits. As the size of MOSFETs and other devices decrease, the dimensions of source/drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices.

Silicon-on-insulator (SOI) technology allows the formation of high-speed, shallow-junction devices. In addition, SOI devices improve performance by reducing parasitic junction capacitance.

In a SOI substrate, a buried oxide (BOX) film made of silicon oxide is formed on single crystal silicon, and a single crystal silicon thin film is formed thereon. Various methods for fabricating such SOI substrates are known. One such method is Separation-by-Implanted Oxygen (SIMOX), wherein oxygen is ion implanted into a single crystal silicon substrate to form a BOX film.

Another method of forming a SOI substrate is wafer bonding, wherein two semiconductor substrates with silicon oxide surface layers are bonded together at the silicon oxide surfaces to form a BOX layer between the two semiconductor substrates.

Another SOI technique is Smart Cut®, which also involves bonding semiconductor substrates through oxide layers. In the Smart Cut® method, one of the semiconductor substrates is doped with hydrogen ions prior to bonding. The hydrogen ion doping subsequently allows the hydrogen ion doped substrate to be split from the bonded substrates leaving behind a thin layer of silicon on the surface.

Shallow junction transistors use shallow trench isolation (STI) techniques to separate devices and circuits. STI techniques significantly increase manufacturing cost because the STI process consists of a number of processing steps and apparatuses, such as thermal oxidation, silicon nitride chemical vapor deposition (CVD), silicon nitride wet etch, reactive ion etch (RIE), high density plasma (HDP) silicon oxide deposition, wet clean, chemical-mechanical polishing (CMP), and photolithography. The uniformity and yield of wafers is also a concern in view of the additional processing steps required for STI processing.

Mesa isolation processing is an alternative to STI to electrically isolate adjacent semiconductor devices formed on a common substrate. In mesa processing, the silicon layer between adjacent semiconductor devices are removed by etching. However, the exposed silicon layer sidewalls of the semiconductor device are susceptible to current leakage. Thus, mesa isolation processing comprises fewer manufacturing steps to isolate adjacent semiconductor devices than STI processing.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for methodology of forming a plurality of semiconductor devices on a common substrate that combines the performance improvements of SOI technology and manufacturing efficiency of mesa isolation processing. There further exists a need in this art for semiconductor devices formed with reduced current leakage through exposed silicon sidewalls. There also exists a need in this art for methodology for forming a plurality of semiconductor devices on extremely thin SOI (ETSOI) structures. ETSOI structures have SOI silicon layers of less than 20 nm thickness.

These and other needs are met by embodiments of the present invention, which provide a method of forming a plurality of semiconductor devices comprising providing a silicon-on-insulator structure comprising a substrate, an insulating layer overlying the substrate, and a silicon layer overlying the insulating layer. The thickness of the silicon layer is less than 20 nm. The silicon layer is patterned to create at least two laterally spaced apart silicon layers, and a semiconductor device is formed at each of the at least two laterally spaced apart silicon layers.

These and other needs are further met by embodiments of the present invention, which provide a silicon-on-insulator structure comprising at least two semiconductor devices formed thereon. The silicon-on-insulator structure comprises a substrate layer, an insulating layer overlying the substrate, and a silicon layer having a thickness of less than 20 nm overlying the insulating layer. The silicon layer comprises at least two laterally spaced apart silicon layers, and at least one semiconductor device is formed at each of the two laterally spaced apart silicon layers.

This invention addresses the needs for an efficiently-manufactured, high-speed semiconductor device with improved electrical characteristics.

The foregoing and other features, aspects, and advantages of the present invention will become apparent in the following detailed description of the present invention when taken in conjunction with the accompanying drawings.

DETAILED DESCRIPTION OF THE INVENTION

Figure 1A:
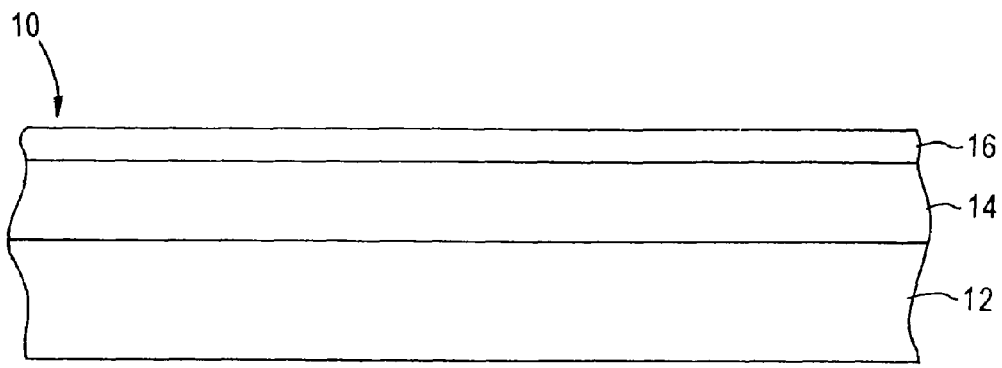
FIGS. 1A–1K illustrate the formation of a SOI semiconductor device using a shallow trench isolation technique.

The present invention enables the production of improved high-speed semiconductor devices with the benefits of ETSOI technology. The present invention further provides the manufacturing efficiencies provided by mesa isolation fabrication techniques. In addition, the present invention reduces the SOI semiconductor device current leakage through exposed silicon layer sidewalls.

The invention will be described in conjunction with the formation of the ETSOI semiconductor devices illustrated in the accompanying drawings. However, these are exemplary only as the claimed invention is not limited to the formation of the specific devices illustrated in the drawings.

Typically, thin SOI semiconductor devices use shallow trench isolation (STI) techniques to electrically isolate adjacent semiconductor devices formed on a common substrate. A typical STI technique will be described. A SOI structure 10 is provided with a silicon layer 16 and an insulating layer 14 overlying a substrate 12. The substrate 12 is typically a silicon wafer. The insulating layer 14 is a buried oxide (BOX) layer. The SOI structure 10, as illustrated in FIG. 1A, can be formed by conventional techniques, such as SIMOX, Smart Cut®, or wafer bonding techniques.

Alternately, SOI wafers can be obtained from commercial sources, such as Ibis Technology Corporation. Typical silicon layer 16 thicknesses range from about 30 nm to about 100 nm. The BOX layer 14 can have thickness of from about 50 nm to about 400 nm.

Figure 1B:
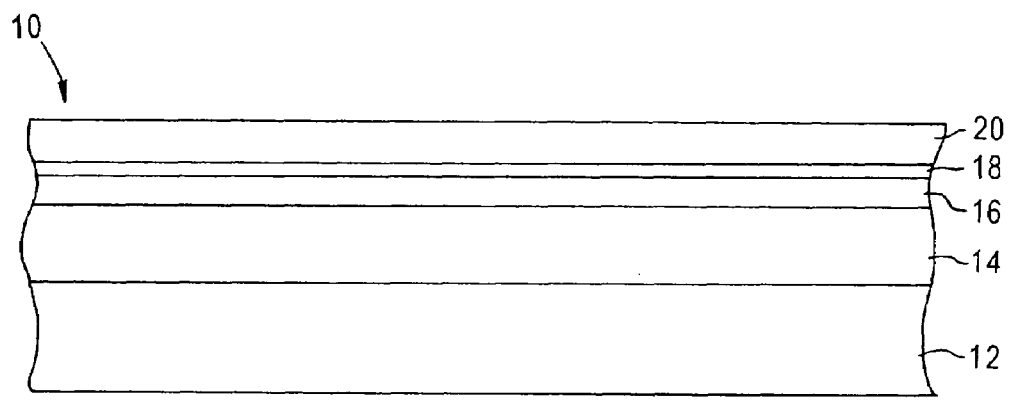

As illustrated in FIG. 1B, a silicon oxide layer 18 is formed over the silicon layer 16. The oxide layer 18 can be deposited, such as by chemical vapor deposition (CVD), or the top surface of the silicon layer 16 can be thermally oxidized. A silicon nitride layer 20 is subsequently deposited over the oxide layer 18. The thickness of the oxide layer 18 ranges from about 5 nm to about 100 nm. The thickness of the nitride layer 20 ranges from about 50 nm to about 300 nm.

Figure 1C:
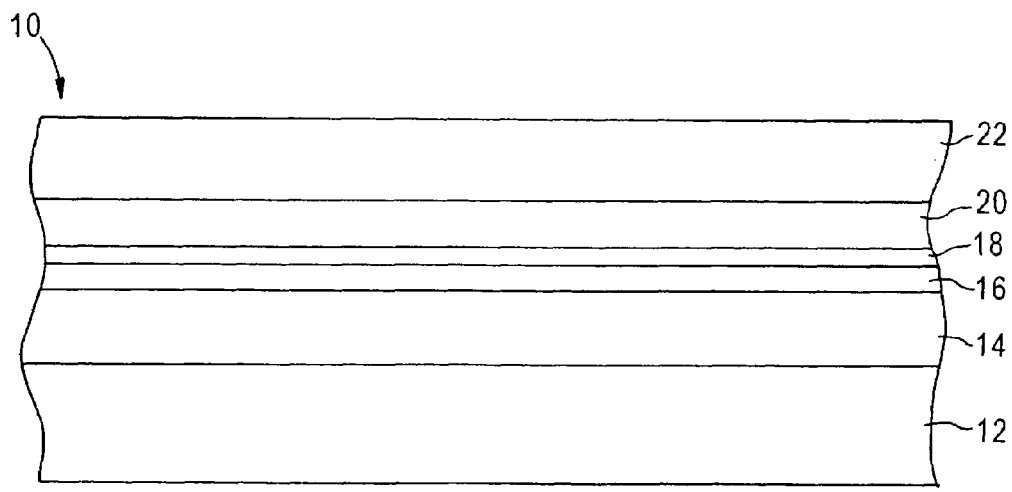
Figure 1D:
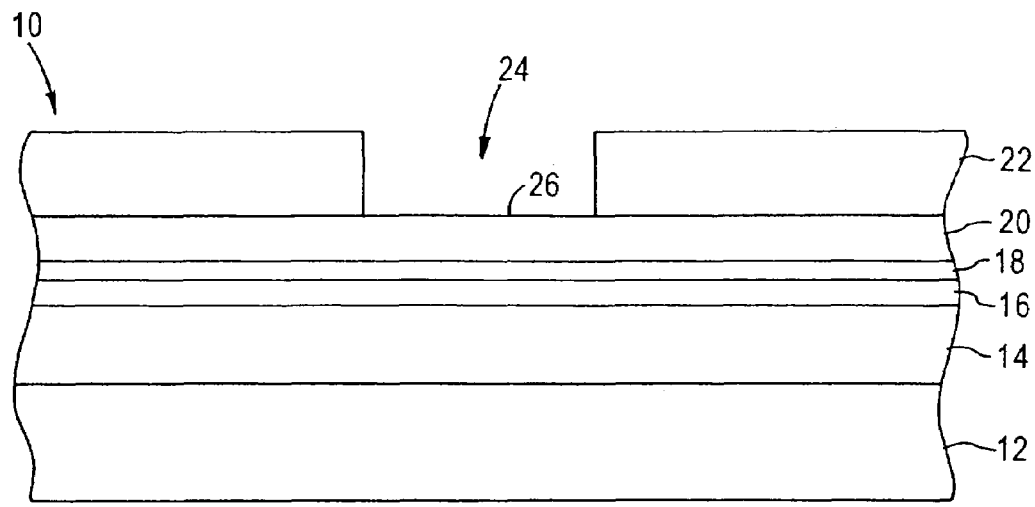
Figure 1E:
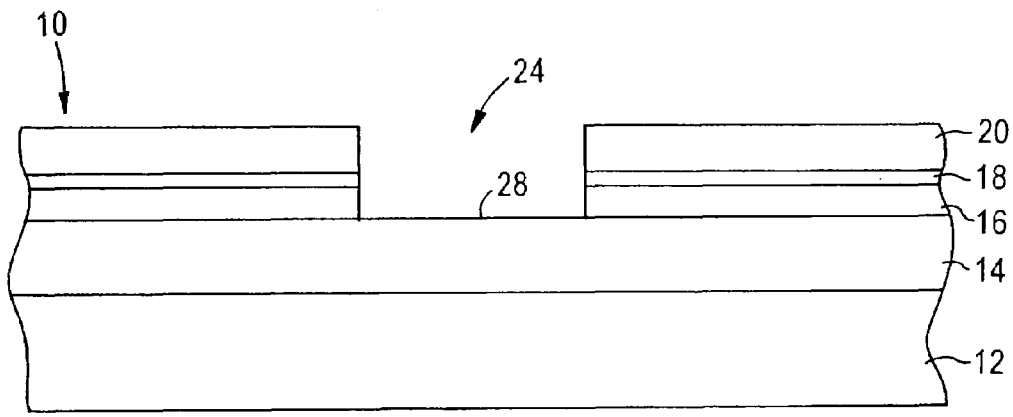

A photoresist layer 22 is formed over the nitride layer 20, such as by spin coating, as shown in FIG. 1C. An opening 24 is subsequently formed in the photoresist layer 22 by photolithographic patterning. Typical photolithographic patterning steps include selectively exposing the photoresist layer 22 to actinic radiation, such as by masking the SOI structure 10 and exposing the SOI structure 10 to ultraviolet radiation. The selectively exposed photoresist layer 22 is subsequently developed using a suitable liquid developer to form opening 24, exposing the surface 26 of the silicon layer 16 as illustrated in FIG. 1D. The SOI structure 10 is subsequently anisotropically etched to extend the opening 24 in the photoresist layer 22 through the nitride layer 20, oxide layer 18, and silicon layer 16 to expose the surface 28 of the BOX layer 14, as illustrated in FIG. 1E. After etching the SOI structure 10, the photoresist layer 22 is stripped from the SOI structure 10.

Figure 1F:
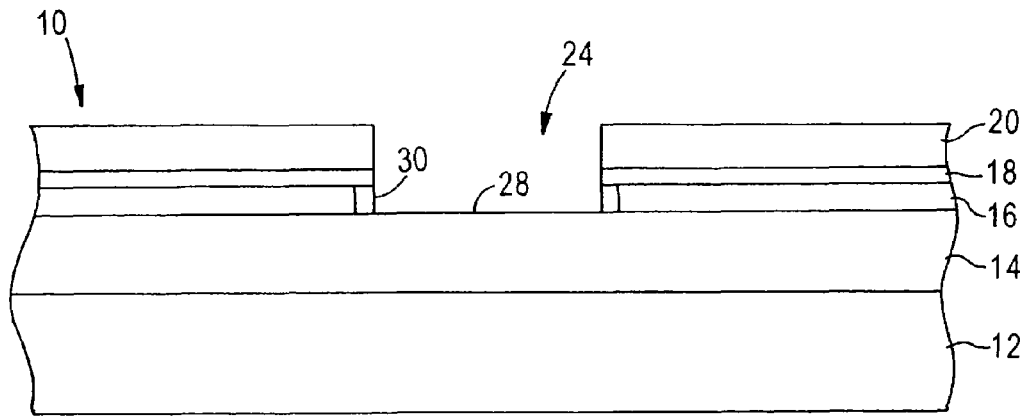
Figure 1G:
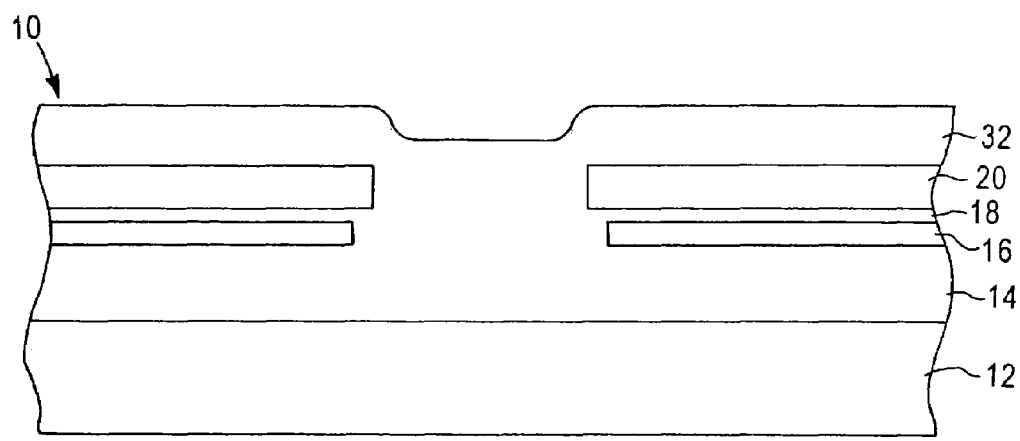
Figure 1H:
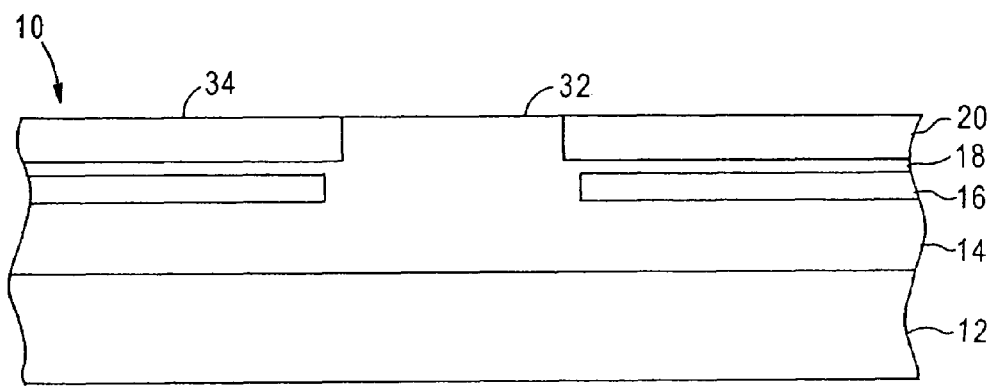
Figure 1I:
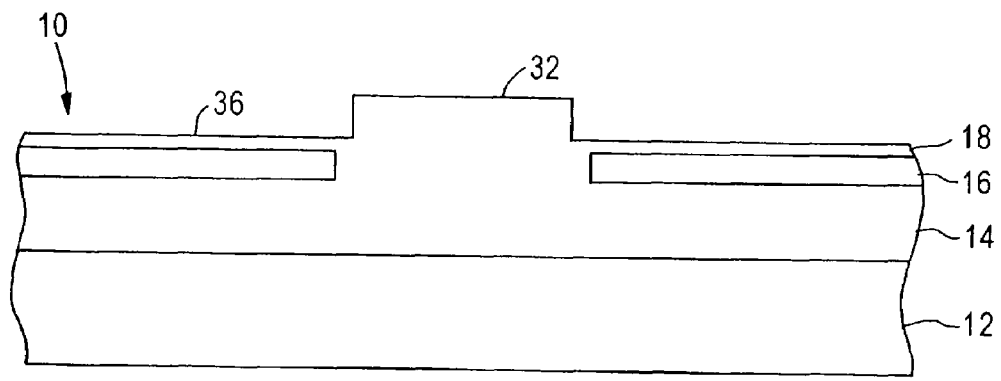
Figure 1J:
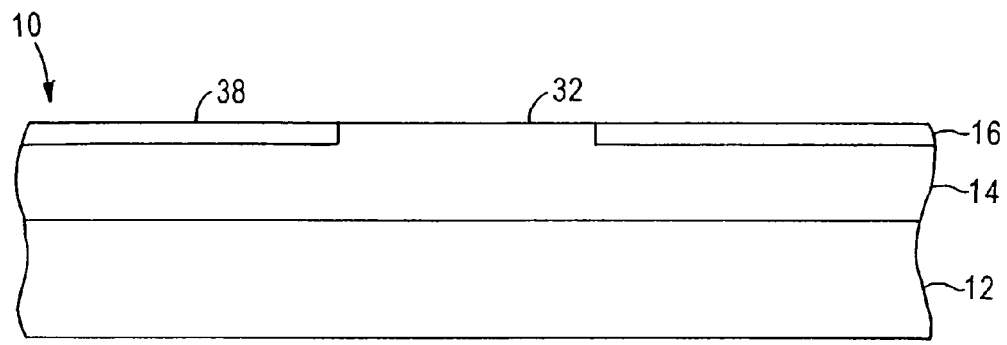
Figure 1K:
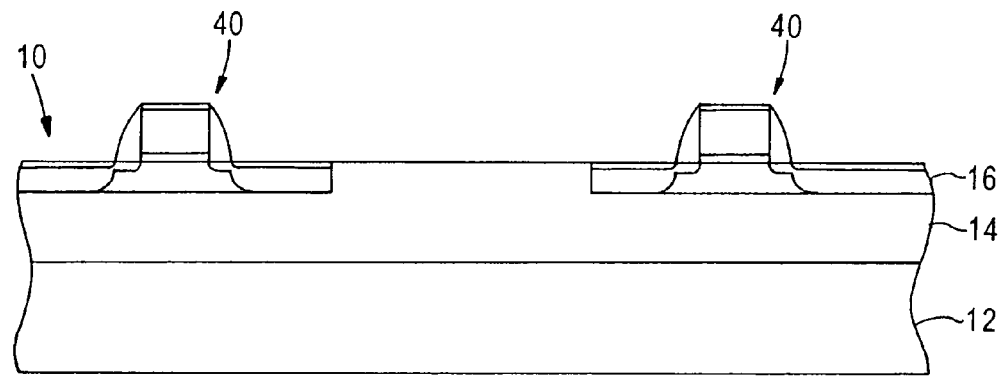

As illustrated in FIG. 1F, the SOI structure 10 is subsequently heated to form a thermal oxide liner 30 on the silicon layer 16. The opening 24 is subsequently filled with silicon oxide 32, such as by high density plasma chemical vapor deposition (HDPCVD), as shown in FIG. 1G. As illustrated in FIG. 1H, the SOI structure 10 is subsequently planarized by chemical-mechanical polishing (CMP) to expose a surface 34 of the nitride layer 20. The nitride layer 20 is subsequently removed by a hot phosphoric acid etch, as illustrated in FIG. 1I. The resulting structure 10 is then etched, using a hydrofluoric acid-based etchant, to remove the deposited silicon layer 32 and expose a surface 38 of the silicon layer 16, as illustrated in FIG. 1J. As shown in FIG. 1K, a plurality of electrically isolated semiconductor devices, such as MOSFETs 40, can now be formed on the SOI structure 10.

Figure 2A:
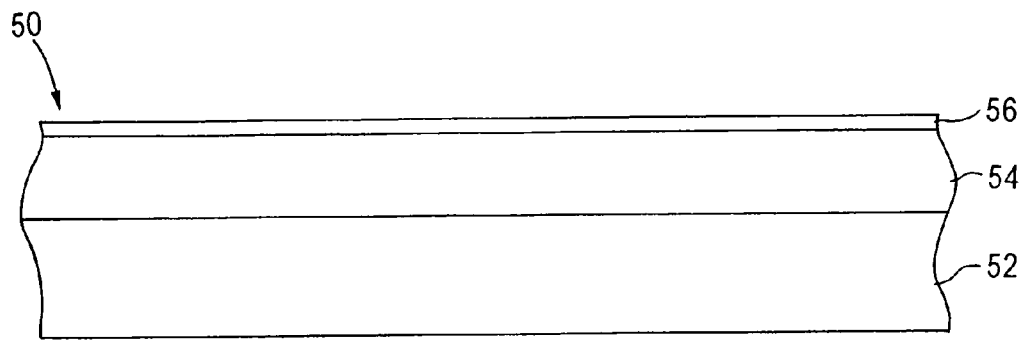
FIGS. 2A–2E illustrate the formation of an ETSOI semiconductor device according to an embodiment of the present invention.

In contrast to the many manufacturing steps involved in the STI process, mesa isolation of silicon layers is a more efficient manufacturing technique. A method of forming a plurality of ETSOI semiconductor devices on a common SOI structure using mesa isolation techniques will be described. A SOI structure 50 is provided with an extremely thin silicon layer 56 and an insulating layer 54 overlying a substrate 52. Extremely thin silicon layers 56 have a thickness less than 20 nm. In certain embodiments of the present invention, the silicon layer 56 thickness ranges from about 5 nm to about 15 nm. In certain embodiments of the present invention, the thickness of the silicon layer 56 ranges from about 8 nm to about 10 nm. The substrate 52 can be a silicon wafer and the insulating layer 54 is a BOX layer. In certain embodiments of the present invention, the thickness of the BOX layer 54 ranges from about 50 nm to about 400 nm. In certain embodiments of the present invention, the thickness of the BOX layer 54 ranges from about 200 nm to about 300 nm. The SOI structure 50, as illustrated in FIG. 2A, can be formed by conventional techniques, such as SIMOX, Smart Cut®, or wafer bonding techniques.

Figure 2B:
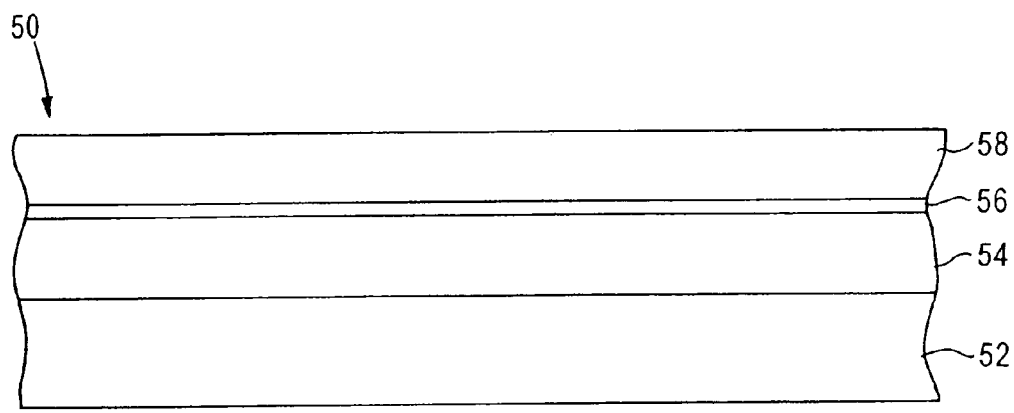
Figure 2C:
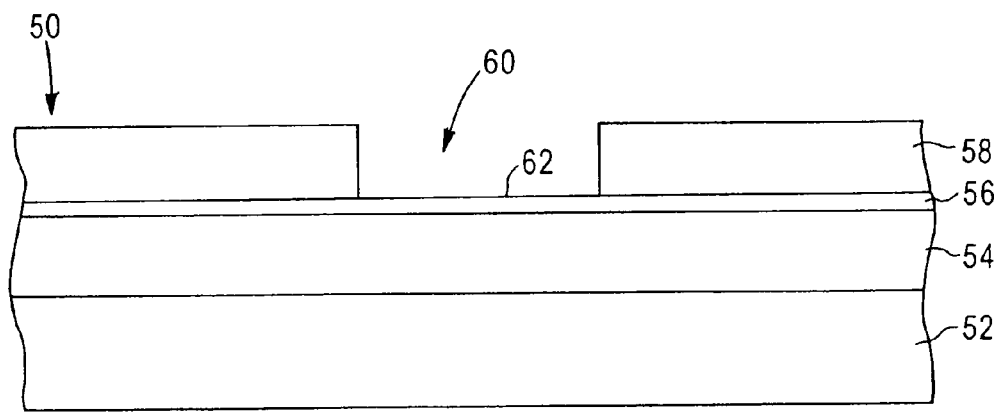
Figure 2D:
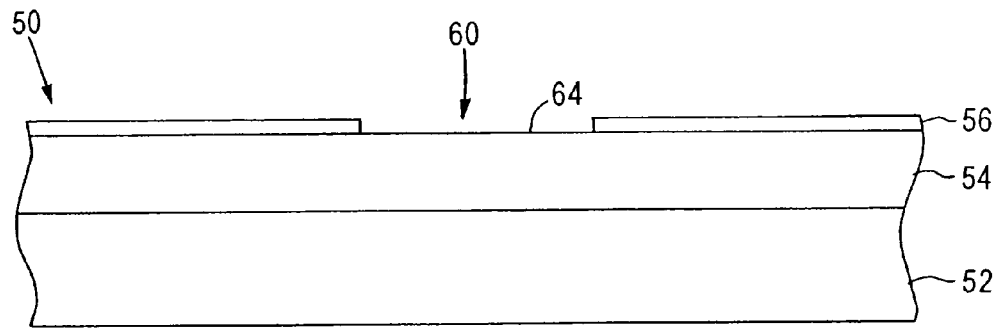

As illustrated in FIG. 2B, a photoresist layer 58 is formed over the silicon layer 56, such as by spin coating. As shown in FIG. 2C, an opening 60 is subsequently formed in the photoresist layer 58 by photolithographic patterning to expose the surface 62 of the silicon layer 56. The SOI structure 50 is anisotropically etched to extend the opening 60 in the photoresist layer 58 through the silicon layer 56 to expose the surface 64 of the BOX layer 54, as illustrated in FIG. 2D.

In certain embodiments of the present invention, a reactive ion etch (RIE) is used to etch the silicon layer 56. A reactive ion etchant comprising hydrogen bromide and chlorine is used in certain embodiments of the present invention. The hydrogen bromide/chlorine etchant has a high selectivity towards silicon oxide, such that etching essentially stops at the surface 64 of the silicon oxide layer. In certain embodiments of the present invention, a two stage RIE is used to form opening 60. In the two stage RIE, the hydrogen bromide/chlorine etchant is used in the first stage and an etchant comprising hydrogen bromide and oxygen in used in the second stage. As the etched portion of the silicon layer 56 approaches the BOX layer 54, the hydrogen bromide/oxygen etchant is used because it has increased selectivity to silicon oxide, thus further protecting the BOX layer 54 from being etched.

Figure 2E:
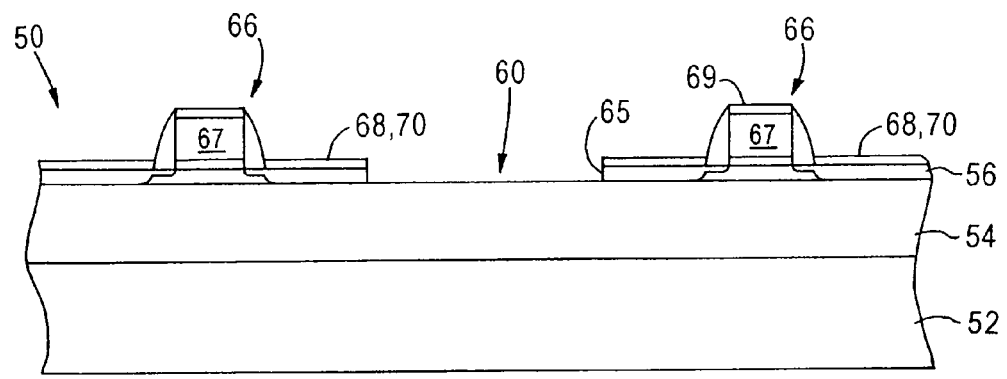

After the plurality of silicon layers 56 are isolated from each other, the photoresist layer 58 is stripped from the SOI structure 50. A plurality of semiconductor devices, such as MOSFETs 66 can be formed at each of the plurality of silicon layers 56, as shown in FIG. 2E. Because the MOSFETs 66 formed on the SOI structure 50 have extremely thin silicon layers 56, in certain embodiments of the present invention, raised source and drain regions 68 are formed over the silicon layers 56. The raised source and drain regions 68 accommodate subsequently formed silicide contacts 70.

Raised source and drain regions 68 are formed on source and drain regions 65 by doped selective epitaxy. In certain embodiments of the present invention, a doped epitaxial layer 68 is deposited to a thickness of from about 300 Å to about 1000 Å on the source and drain regions 65. Doped selective epitaxy is performed with a mixture of gases including silane ($SiH_4$) and a dopant gas in a hydrogen carrier gas. HCl gas may be added to the $SiH_4$/dopant gas mixture. The epitaxial layer is formed at a temperature of about 700° C. to about 900° C. at a pressure from about 1 torr to about 700 torr. Metal silicide contacts 70 are subsequently formed in the raised source and drain regions 68 and metal silicides contacts 69 are formed over the gate electrodes 67. Conventional techniques for forming metal silicide contacts include depositing a metal layer such as nickel, cobalt, or titanium over the structure 50. Metal silicide contacts 69, 70 are formed by heating the metal layer to react it with underlying silicon in the raised source and drain regions 68 and gate electrodes 67. After formation of the metal silicide contacts 69, 70 the metal layer which did not react to form metal silicide is removed by etching.

The at least two laterally spaced apart silicon layers 56 of the immediately adjacent MOSFETs 66 are separated by an air gap 60. There are no thermally formed oxide layers or shallow trench isolation regions between the at least two laterally spaced apart MOSFETs 66.

Figure 3A:
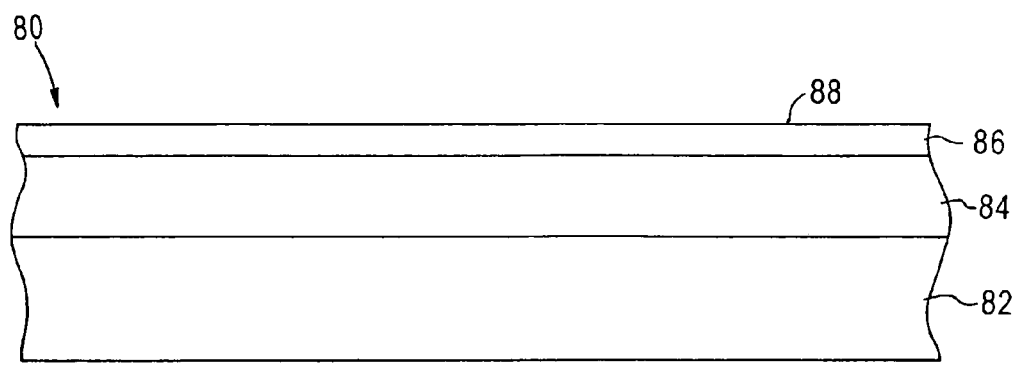
FIGS. 3A–3C illustrate thinning a silicon layer of a SOI structure according to an embodiment of the present invention.
Figure 3B:
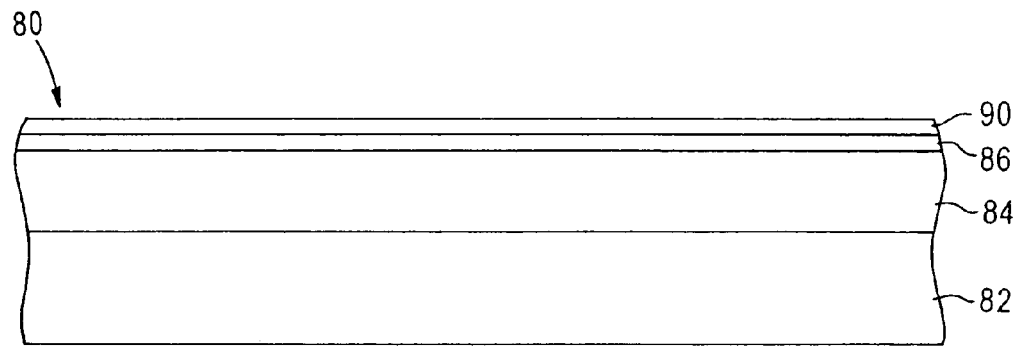
Figure 3C:
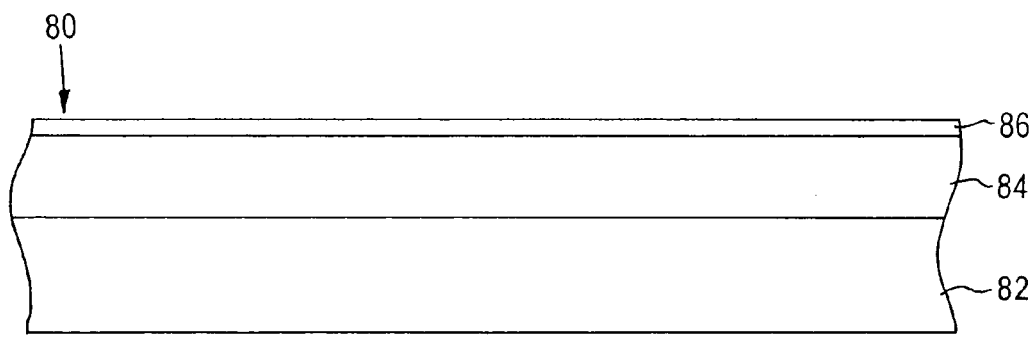

In certain embodiments of the present invention, SOI structures 80, as illustrated in FIG. 3A, that do not have extremely thin silicon layers 86 can be used to form ETSOI structures, as illustrated in FIG. 3A. Such SOI structures 80 comprising a substrate 82, BOX layer 84, and silicon layer 86 are commercially available as conventional SOI silicon wafers 80. In order to provide a ETSOI structure, the silicon layer 86 of the SOI structure 80 is thinned to less than 20 nm thickness. In certain embodiments of the present invention, the surface 88 of silicon layer 86 is thermally oxidized to form a silicon oxide layer 90, as shown in FIG. 3B. The silicon oxide layer 90 is formed by conventional methods, such as by exposing the SOI structure 80 to an oxygen ambient at a temperature of approximately 950° C. to about 1100° C. The silicon oxide layer 90 is formed to a thickness sufficient so that less than a 20 nm thickness of silicon layer 86 remains. The silicon oxide layer 90 is subsequently removed, in certain embodiments of the present invention, by a wet etch, such as hydrofluoric acid or a mixture of hydrofluoric acid and ammonium fluoride (buffered oxide etch). The resulting SOI structure 80 with a silicon layer 86 thickness of less than 20 nm, as shown in FIG. 3C, is subsequently processed to form a plurality of semiconductor devices, as previously described regarding FIGS. 2B–2E.

Figure 4A:
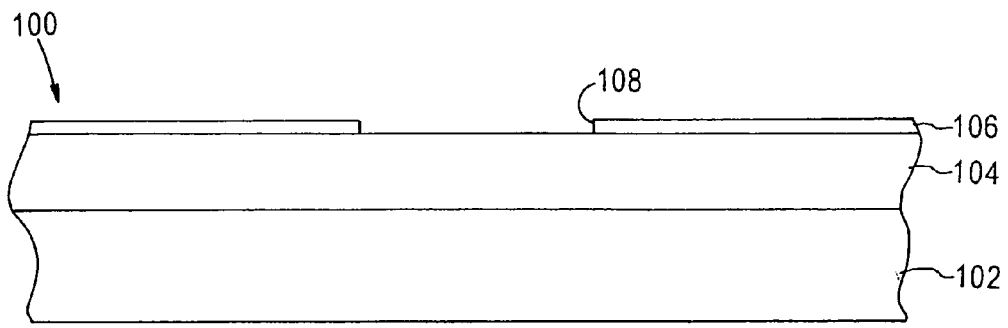
FIGS. 4A–4D illustrate the formation of oxide sidewalls on the silicon layer of a SOI structure according to an embodiment of the present invention.
Figure 4B:
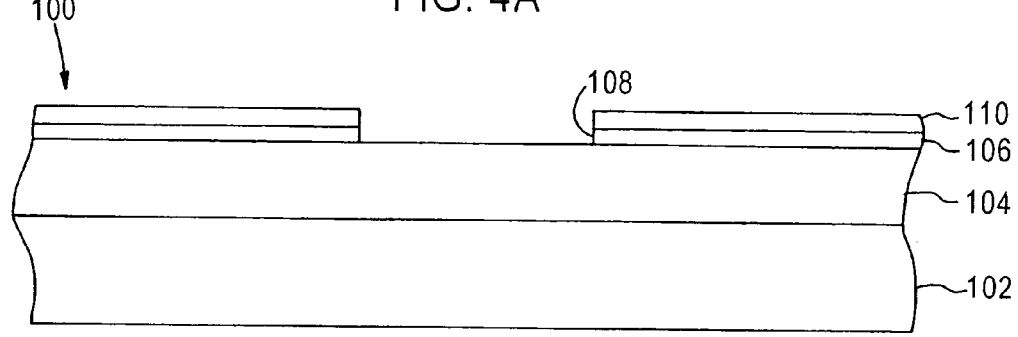
Figure 4C:
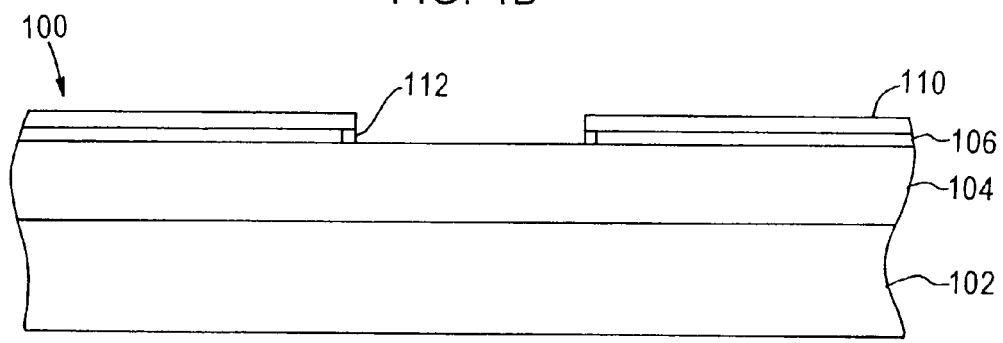
Figure 4D:
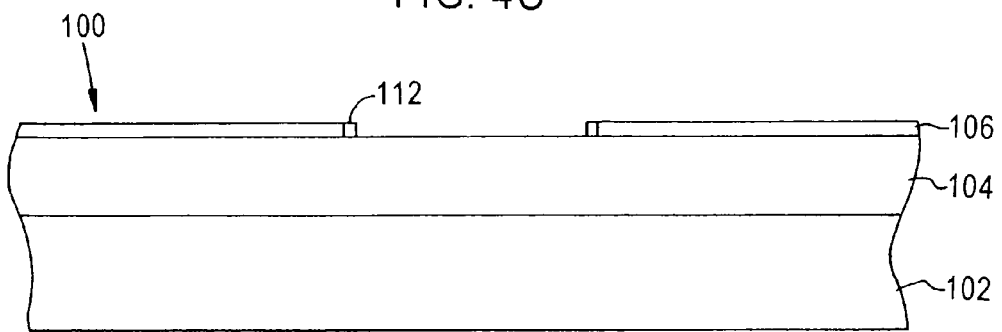

Current leakage through the sidewalls of exposed silicon layers of ETSOI semiconductor devices is reduced to acceptable levels in contrast to current leakage through exposed silicon layer sidewalls in conventional thickness silicon layers. In addition, current leakage can be further reduced in ETSOI devices in certain embodiments of the present invention. An ETSOI structure 100, as illustrated in FIG. 4A, comprising a substrate 102, BOX layer 104, and silicon layer 106 is processed to further reduce current leakage through the exposed silicon layer sidewalls 108. A nitride layer 110 is formed overlying the plurality of laterally spaced apart silicon layers 106, as shown in FIG. 4B. The ETSOI structure 100 is subsequently exposed to an oxygen ambient at a temperature of approximately 950° C. to about 1100° C. to thermally oxidize the silicon layer sidewalls 108 to form a silicon oxide sidewall 112. The nitride layer 110 is subsequently removed, such as by a hot phosphoric acid etch, as illustrated in FIG. 4D. The resulting ETSOI structure 100 is processed to form a plurality of semiconductor devices, as described herein with respect to FIG. 2E.

Figure 5A:
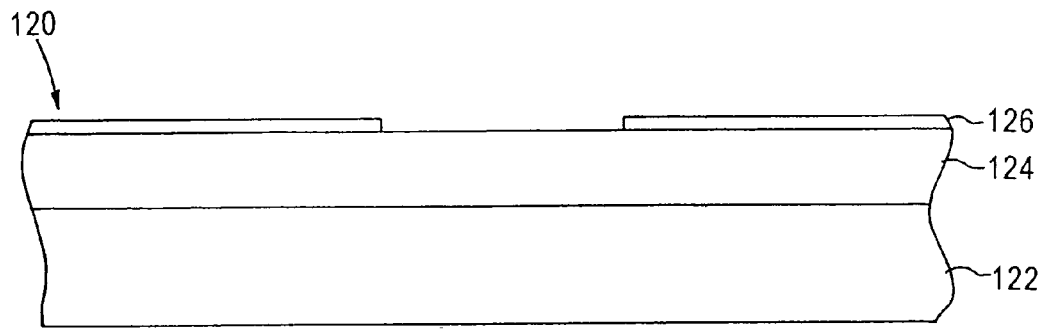
FIGS. 5A–5D illustrate undercutting of silicon layers of a SOI structure and a method of preventing undercutting of the silicon layers according to an embodiment of the present invention.
Figure 5B:
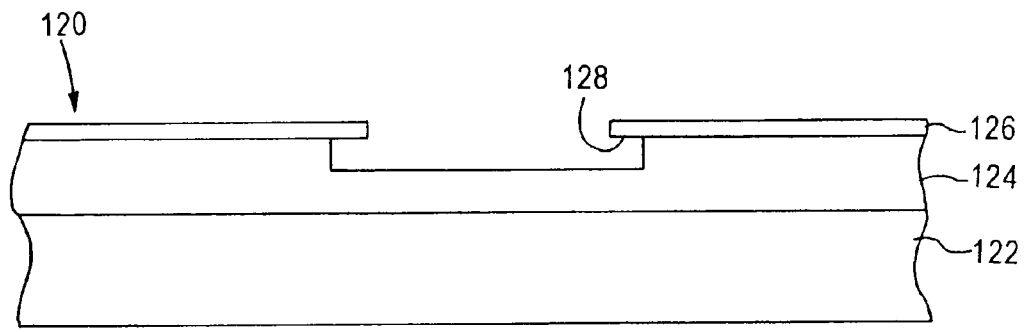
Figure 5C:
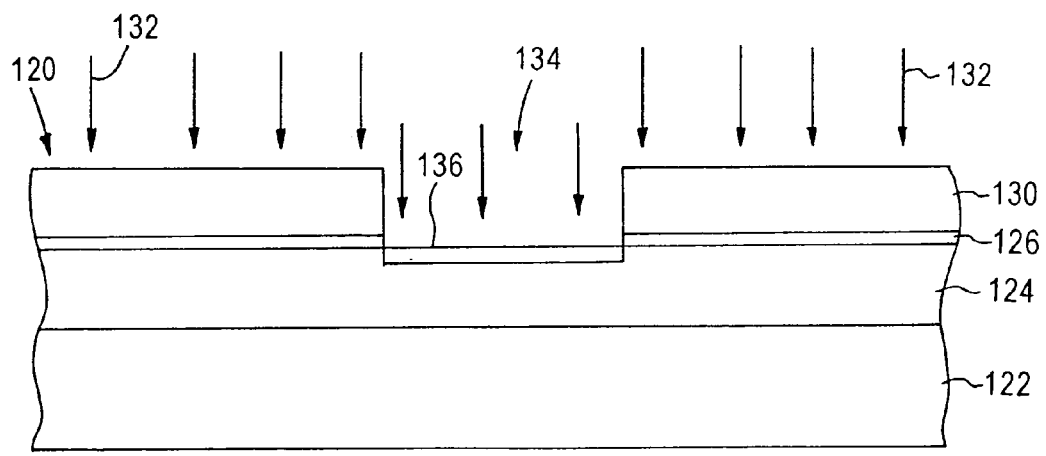
Figure 5D:
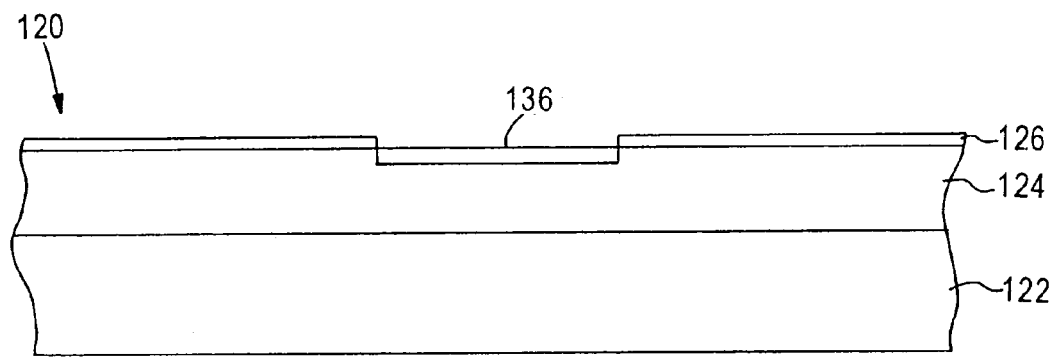

In certain embodiments of the present invention, a wet cleaning step is provided to remove etching residue from an SOI structure. As shown in FIG. 5A, an SOI structure 120 comprising a substrate 122, BOX layer 124, and a plurality of laterally spaced apart silicon layers 126 is subjected to wet cleaning after reactive ion etching. Certain wet cleaning solutions comprise hydrofluoric acid, which can etch the BOX layer 124 undercutting the bottom surface 128 of the silicon layer 126, as shown in FIG. 5B. To protect the SOI structure 120 from undercutting during wet cleaning, a resist layer 130 is deposited on the silicon layer 126. The resist layer 130 is photolithographically patterned, and an electrically neutral dopant 132 is implanted into the region of the SOI structure 134 between the laterally spaced apart silicon layers 126 to form an implant region 136 with a reduced etch rate to wet cleaning solutions, as illustrated in FIG. 5C. The resist layer 130 is subsequently stripped and the resulting SOI structure 120, as shown in FIG. 5D, is processed to form a plurality of semiconductor devices, as described supra with respect to FIG. 2E. In certain embodiments of the present invention, the electrically neutral dopant 132 is carbon or nitrogen implanted at an energy of about 0.5 keV to about 5 keV and at an implantation dose of about $1 \times 10^{12}$ ions/cm$^2$ to about $1 \times 10^{14}$ ions/cm$^2$.

The embodiments of the present invention provide improved SOI semiconductor devices manufactured with improved efficiency than SOI semiconductors manufactured using STI techniques. ETSOI semiconductor devices manufactured according to embodiments of the present invention, do not suffer from the unacceptable levels of current leakage that afflict conventional silicon layer thickness SOI semiconductor devices formed using mesa isolation techniques.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A method of forming a plurality of semiconductor devices comprising:
   providing a silicon-on-insulator structure comprising a substrate, an insulating layer overlying said substrate, and a silicon layer overlying said insulating layer, wherein said silicon layer has a thickness less than 20 nm;
   patterning the silicon layer to create at least two laterally spaced apart silicon layers; and
   forming a semiconductor device at each of said at least two laterally spaced apart silicon layers.

2. The method of forming a plurality of semiconductor devices according to claim 1, wherein said step of providing a silicon-on-insulator structure further comprises:
   providing a silicon-on-insulator structure with a silicon layer having a thickness of 20 nm or greater; and
   thinning the silicon layer to a thickness less than 20 nm.

3. The method of forming a plurality of semiconductor devices according to claim 2, wherein the step of thinning the silicon layer comprises:
   oxidizing an upper surface of the silicon layer to form a silicon oxide layer; and
   removing said silicon oxide layer.

4. The method of forming a plurality of semiconductor devices according to claim 3, wherein the step of removing said silicon oxide layer comprises etching the silicon oxide layer.

5. The method of forming a plurality of semiconductor devices according to claim 1, wherein the thickness of the silicon layer is from about 5 nm to about 15 nm.

6. The method of forming a plurality of semiconductor devices according to claim 5, wherein the thickness of the silicon layer is from about 8 nm to about 10 nm.

7. The method of forming a plurality of semiconductor devices according to claim 1, wherein said step of patterning the silicon layer comprises:
forming a resist layer on the silicon layer;
forming a pattern in the resist layer; and
transferring the pattern in the resist layer into the silicon layer to expose a portion of the insulating layer.

8. The method of forming a plurality of semiconductor devices according to claim 7, wherein said step of transferring the pattern in the resist layer into the silicon layer comprises etching the silicon layer with a reactive ion etch.

9. The method of forming a plurality of semiconductor devices according to claim 8, wherein an etchant comprising hydrogen bromide and chlorine is used in the etching step.

10. The method of forming a plurality of semiconductor devices according to claim 9, wherein the silicon layer is etched in two stages, wherein a first stage etch comprises using the etchant comprising hydrogen bromide and chlorine and a second stage etch comprises using an etchant comprising hydrogen bromide and oxygen.

11. The method of forming a plurality of semiconductor devices according to claim 1, wherein the semiconductor devices formed at each of said at least two laterally spaced apart silicon layers are MOSFETs.

12. The method of forming a plurality of semiconductor devices according to claim 11, further comprising the step of forming raised source and drain regions in said MOSFETs by doped selective epitaxy.

13. A method of forming a plurality of semiconductor devices comprising:
providing a silicon-on-insulator structure comprising a substrate, an insulating layer overlying said substrate, and a silicon layer overlying said insulating layer, wherein said silicon layer has a thickness less than 20 nm:
patterning the silicon layer to create at least two laterally spaced apart silicon layers:
forming a silicon nitride layer on upper surfaces of the at least two laterally spaced apart silicon layers;
forming a silicon oxide layer on sidewalls of the at least two laterally spaced apart silicon layers by thermal oxidation of the sidewalls of the at least two laterally spaced apart silicon layers with silicon nitride formed on the upper surfaces;
removing said silicon nitride layer;
forming a semiconductor device at each of said at least two laterally spaced apart silicon layers.

14. A method of forming a plurality of semiconductor devices comprising:
providing a silicon-on-insulator structure comprising a substrate, an insulating layer overlying said substrate, and a silicon layer overlying said insulating layer, wherein said silicon layer has a thickness less than 20 nm:
patterning the silicon layer to create at least two laterally spaced apart silicon layers:
forming a semiconductor device at each of said at least two laterally spaced apart silicon layers; and
implanting a dopant selected from the group consisting of carbon and nitrogen into a region of said insulating layer between the at least two laterally spaced apart silicon layers.

15. The method of forming a plurality of semiconductor devices according to claim 13, wherein said step of providing a silicon-on-insulator structure further comprises:
providing a silicon-on-insulator structure with a silicon layer having a thickness of 20 nm or greater; and
thinning the silicon layer to a thickness less than 20 nm.

16. The method of forming a plurality of semiconductor devices according to claim 15, wherein the step of thinning the silicon layer comprises:
oxidizing an upper surface of the silicon layer to form a silicon oxide layer; and
removing said silicon oxide layer.

17. The method of forming a plurality of semiconductor devices according to claim 13, wherein the semiconductor devices formed at each of said at least two laterally spaced apart silicon layers are MOSFETs.

18. The method of forming a plurality of semiconductor devices according to claim 14, wherein said step of providing a silicon-on-insulator structure further comprises:
providing a silicon-on-insulator structure with a silicon layer having a thickness of 20 nm or greater; and
thinning the silicon layer to a thickness less than 20 nm.

19. The method of forming a plurality of semiconductor devices according to claim 18, wherein the step of thinning the silicon layer comprises:
oxidizing an upper surface of the silicon layer to form a silicon oxide layer; and
removing said silicon oxide layer.

20. The method of forming a plurality of semiconductor devices according to claim 14, wherein the semiconductor devices formed at each of said at least two laterally spaced apart silicon layers are MOSFETs.

* * * * *